Jan. 21, 1969 R. M. HAYES 3,423,685
BOOTSTRAPPED CASCODE DIFFERENTIAL AMPLIFIER
Filed Aug. 27, 1964
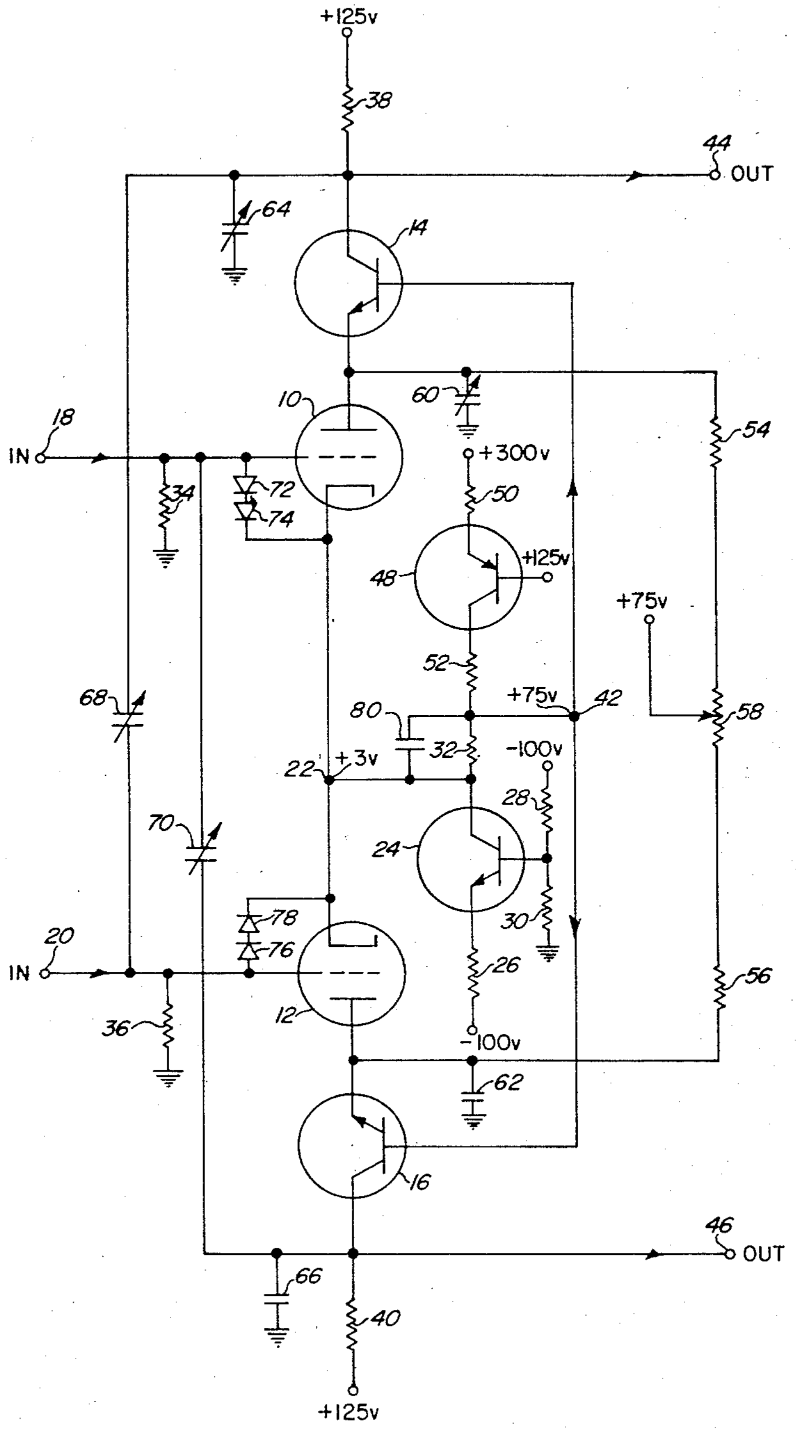
ROY M. HAYES
INVENTOR.
BY
BUCKHORN, BLORE, KLARQUIST & SPARKMAN
ATTORNEYS

United States Patent Office 3,423,685

Patented Jan. 21, 1969

3,423,685

BOOTSTRAPPED CASCODE DIFFERENTIAL AMPLIFIER

Roy M. Hayes, Portland, Oreg., assignor to Tektronix, Inc., Beaverton, Oreg., a corporation of Oregon Filed Aug. 27, 1964, Ser. No. 392,420
U.S. Cl. 330—3 7 Claims
Int. Cl. H03f 5/00, 21/00

ABSTRACT OF THE DISCLOSURE

A differential amplifier includes a pair of signal translating devices having their input electrodes coupled to amplifier input terminals, their output electrodes coupled to amplifier output terminals, and having their common electrodes coupled together. Voltage clamp means couple the said common electrodes to the respective device output electrodes for maintaining a substantially constant voltage difference across each translating device. As a result, a common mode signal applied to the input terminals will not change the voltage difference across the translating devices, and therefore a common mode output signal attributable to voltage differences across the translating devices will not be transmitted.

The subject matter of the present invention relates generally to electrical signal amplifier circuits, and in particular to differential amplifiers having a high common mode rejection ratio for input signals containing a common mode signal component whose amplitude varies over a large range.

The differential amplifier of the present invention is especially useful when employed as a D.C. coupled vertical amplifier in a cathode ray oscilloscope and has an extremely high common mode rejection ratio on the order of 100,000 to 1 over a wide frequency range of about D.C. to 100 kilocycles per second. Some of the present differential amplifiers have been produced with a common mode rejection ratio as high as 500,000 to 1 over this frequency range. Also, the present differential amplifier has a higher frequency response and can be designed for transmitting signals up to 10 megacycles per second, but the common mode rejection ratio at these higher frequencies is considerably reduced.

The differential amplifier of the present invention has several other advantages over conventional amplifiers including low input capacitance, a high degree of isolation between the input and output terminals of the amplifier, as well as a low noise output. In addition, the present amplifier has lower D.C. voltage between its common and output terminals than amplifiers having conventional cascode stages since it employs a transistor output stage to provide a hybrid cascode amplifier for each side of the differential amplifier. Also, this hybrid cascode amplifier provides a low input impedance for input current signals applied to the emitter of the transistor and a high output impedance, as well as a near unity voltage gain for the bootstrapped common mode signal applied to the base of the transistor and transmitted from the emitter of such transistor to the anodes of the tubes in such amplifier. Other advantages of the present amplifier are its great stability for rejection ratios as high as 100,000 to 1 and its relatively simple circuitry.

One of the difficulties in designing a differential amplifier, having a high common mode rejection ratio is in selecting the circuit components which must absorb the common mode signal because such components must be stable with time and temperature and provide a linear response with current and voltage changes. While passive components such as resistors satisfy these requirements fairly well, active components such as tubes and transistors do not because they are very unstable with time and temperature and are so nonlinear in their response characteristics that no two devices have the same response characteristics. In order to enable rejection of the common mode signals, the circuit components must maintain the same characteristics throughout changes in amplitude or swing of the common mode signal. Thus, previous differential amplifiers, such as that shown in U.S. Patents 2,941,155 by Lucas and 3,124,762 by Reaves, which transmitted the common mode signal through vacuum tubes or transistors before rejecting such common signal, have a lower common mode rejection ratio than the circuit of the present invention because no two vacuum tubes or transistors have the same operating characteristics so that they cannot "track" each other exactly. This nonuniform tracking causes conventional differential amplifier circuits to become unbalanced during large swings of the common mode signal and produces a differential signal at the output of the amplifier.

In order to overcome this problem, the differential amplifier circuit of the present invention employs a bootstrap circuit to clamp the voltages of the cathode and anode of each vacuum tube in the input stage of such amplifier to the voltage on the grid of such tube which is connected to the input terminal of the amplifier. This causes the input tubes to "float" with the common mode signal so that such common mode signal produces no output signal at the output terminal of such differential amplifier. In other words, once the tubes are D.C. balanced, they appear identical when no input signals are applied thereto, and the operating points of the tubes are maintained the same when common mode signals are applied thereto because such common signal produces no change in the voltage difference across such tubes. As a result, the nonlinearity and nonuniform tracking of the tubes is of no consequence because the operating characteristics of such tubes are maintained the same in the presence of common mode signals.

It is therefore one object of the present invention to provide an improved differential amplifier circuit having a high common mode rejection ratio for large swings in amplitude of the common mode signal.

Another object of the present invention is to provide an improved differential amplifier having low input capacitance, a high signal to noise ratio, and a high output impedance to isolate the input and output terminals of such amplifier.

A further object of the present invention is to provide an improved differential amplifier employing a pair of hybrid cascode amplifier circuits connected in push-pull with the cathodes of the input tubes of such amplifiers connected through a voltage clamping circuit to the bases of the output transistors of such amplifiers in order to cause the voltage across such tubes to float with common mode signals applied to the inputs of such differential amplifier in order to maintain the operating point of such tubes substantially constant during large changes in amplitude of the common mode signal.

An additional object of the present invention is to provide a differential amplifier employing a voltage clamping circuit to maintain the voltage across the input tubes of such amplifier substantially constant when common mode signals are applied thereto to absorb any changes in amplitude of the common mode signals without producing a differential signal at the output of such amplifier.

Still another object of the present invention is to provide an improved differential amplifier which is D.C. coupled and has a wide band frequency response with little signal distortion.

Other objects and advantages of the present invention will be apparent from the following detailed description of a preferred embodiment thereof and from the attached drawing of which:

The figure shows one embodiment of the differential amplifier of the present invention.

The differential amplifier of the present invention includes a pair of input vacuum tubes 10 and 12 which may be triodes of the Nuvister type and a pair of output transistors 14 and 16 which may be of the NPN junction type having their emitters connected to the anodes of such input tubes. The grids of input tubes 10 and 12 are connected to input terminals 18 and 20, respectively, of the differential amplifier while the cathodes of such tubes are connected together at a common point 22 so that such tubes are connected as common cathode amplifiers forming the input stage of the differential amplifier circuit. The cathodes of tubes 10 and 12 are connected in common to a source of substantially constant current including a transistor 24 which may be of the NPN junction type having its emitter connected to a source of negative D.C. supply voltage of −100 volts through a bias resistor 26 of 12.4 kilohms. The base of transistor 24 is connected between a pair of voltage divider resistors 28 and 30 of 10 kilohms and 30.9 kilohms, respectively, which are connected between a source of negative D.C. bias voltage of −100 volts and ground to apply a D.C. bias voltage of approximately −25 volts to the base of such transistor. Since the forward bias voltage drop across the emitter junction of transistor 24 is constant at about ½ volt, the emitter of such transistor is maintained at about −25 volts so that a substantially constant D.C. current of 6 milliamperes flows through resistor 26 to the collector of such transistor. The collector of transistor 24 is connected to one terminal of a coupling resistor 32 of 37.4 kilohms and to the common cathode connection point 22, and the 6 milliamperes of current supplied to the collector of transistor 24 divides into two currents, one being a constant current of 4 milliamperes flowing to the common connection point 22 and through the cathodes of tubes 10 and 12, and the other being a constant current of 2 milliamperes flowing through coupling resistor 32.

The bias current flowing through transistor 24 can be adjusted to maintain the cathode of tubes 10 and 12 at a D.C. bias voltage of about +3 volts and render such tubes normally conducting since their grids are connected to ground through bias resistors 34 and 36 of 1 megohm each. The collectors of output transistors 14 and 16 are connected to sources of positive D.C. supply voltage of +125 volts through load resistors 38 and 40 of 12.4 kilohms each. The bases of such transistors are connected together at a common point 42 which is connected to the other terminal of the coupling resistor 32. Thus, the output transistors 14 and 16 are connected as common base amplifiers insofar as input signals transmitted to the emitters of such transistors. As a result, the two pairs of input tube and output transistors form a hybrid cascode amplifier on opposite sides of the differential amplifier. The collectors of output transistors 14 and 16 are connected to output terminals 44 and 46, respectively, in order to transmit a differential output signal thereto when a differential input signal is applied between input terminals 18 and 20.

In order to more effectively reject any common mode signal applied to input terminals 18 and 20, the cathodes of tubes 10 and 12 are connected through a voltage clamping or bootstrap circuit including coupling resistor 32 to the bases of transistors 14 and 16. The emitter of transistor 48 is connected to a source of positive D.C. supply voltage of +300 volts through a bias resistor 50 of 84.5 kilohms, and its base is connected to a source of positive D.C. bias voltage of +125 volts so that a substantially constant current of about 2.1 milliamperes flows through such bias resistor to the collector of such transistor. The collector of transistor 48 is connected through a resistor 52 of 12 kilohms to the upper terminal of coupling resistor 32 and to the common connection point 42 of the bases of output transistors 14 and 16. As a result, approximately 2.1 milliamperes of D.C. current flowing through resistor 52 divides with about 2 milliamperes flowing through coupling resistor 32 and 0.1 milliampere flowing as base current in output transistors 14 and 16. Thus, the two constant current sources provided by transistors 24 and 48 maintain the voltage between the opposite terminals of coupling resistor 32 constant. This means that the cathodes of tubes 10 and 12 are maintained at a substantially constant voltage difference with respect to the bases of output transistors 14 and 16. Since the forward bias voltage across the emitter junction of each of the output transistors is always about ½ volt, the anodes of the input tubes are also maintained at approximately the same voltage difference with respect to the cathodes of such tubes.

It should be noted that the emitters of the output transistors 14 and 16 are also connected through a pair of bias resistors 54 and 56 of 1 megohm each to the end terminals of a potentiometer 58 of 2 megohms whose movable contact is connected to a source of negative D.C. supply voltage of 75 volts to D.C. balance the differential amplifier by adjustment of such potentiometer. A variable shunt capacitor 60 of 2 to 8 picofarads is connected between the anode of tube 10 and ground, and a fixed shunt capacitor 62 of 4.7 picofarads is connected between the anode of tube 12 and ground for high frequency compensation. Also, a variable capacitor 64 of 8 picofarads is connected between the collector of output transistor 14 and ground, and a fixed capacitor 66 of 4.7 picofarads is connected between the collector of output transistor 16 and ground for the same purpose. In addition, a pair of variable capacitors 68 and 70 of 1.35 picofarads each are connected respectively between the input 20 and output 44 and between the input 18 and the output 46. Capacitor 68 provides cross neutralization of the stray capacitance from input terminal 20 to input terminal 18, common cathode point 22, common base point 42 and the grid to anode capacity of tube 12, while capacitor 70 provides cross neutralization of the stray capacitance from input terminal 18 to input terminal 20, common cathode point 22 and the grid to anode capacity of tube 10. Also, a pair of series connected diodes 72 and 74 are connected between the grid and cathode of tube 10, and a second pair of series connected diodes 76 and 78 are between the grid and cathode of input tube 12. These two pairs of diodes 72–74 and 76–78 prevent damage to tubes 10 and 12 during their warm up when no current flows in such tubes by preventing the grid to cathode voltage of such tubes from exceeding +1.5 volts. When the tubes 10 and 12 become conductive, these two pairs of diodes are reversed biased by the +3 volts potential on the cathodes of such tubes so that positive input signals are applied to the grids of the tubes.

The operation of the differential amplifier in the rejection of common mode signals is hereafter described. When a common mode signal is applied to the grids of input tubes 10 and 12, it is transmitted to the cathodes of such tube with substantially the same voltage due to the fact that such cathodes are connected to the high impedance of the constant current source which provides them with substantially unity voltage gain in this cathode follower action. In addition, the anodes of the tubes are connected to the cathodes of such tubes by nearly unity gain bootstrap circuits which aid in this cathode follower action. As a result, the effective input signal seen by the tubes due to the common mode signals is zero so that if such tubes are balanced, no output signal currents are transmitted to their anodes and no differential signal voltage is produced across output terminals 44 and 46. However, if the common mode signal has appreciable amplitude, it could cause the input tubes to become unbalanced due to their operation in dissimilar regions of their plate characteristics, and this would produce a differential output signal at output terminals 44 and 46. In order to prevent this from happening, the voltage clamping or bootstrap circuit, including coupling resistor 32, transmits the common mode signal voltage from the cathodes of tubes 10 and 12 to the bases of output transistors 14 and 16 which then operate as emitter follower amplifiers to transmit such common mode signal to the anodes of the tubes. Since an emitter follower amplifier has very nearly unity voltage gain, the common mode signal transmitted to the anodes of the input tubes 10 and 12 has substantially the same voltage as the common mode signal applied to the grids of such tube and transmitted to the cathodes thereof by the cathode follower action previously described. This means that the tubes "float" with the voltage of the common mode signal so that they do not change their operating points regardless of the "swing" or change in amplitude of such common mode signal. Since the voltage across the tubes does not change with the swing in the common mode signal, no imbalance in the circuit is created which might produce a differential output signal. It should be noted that the common mode signal voltage applied to the bases of the output transistors 14 and 16 is not transmitted to the collectors of such output transistors due to their high output impedance. In other words, the change in voltage across the output transistors does not effect the current through such transistors, and the common mode signals do not produce any change in current flowing through load resistors 38 and 40.

When a differential input signal is applied between the grids of tubes 10 and 12, one of such tubes transmits a different signal voltage to the cathode of the opposite tube so that such tubes each see an effective input signal. As a result, more current flows through one of the input tubes than the other even though a constant current still flows from transistor 24 to the common cathode connection 22. This differential current signal is transmitted to the emitters of output transistors 14 and 16 which have substantially unity current gain in the common base amplifier configuration. The output transistors transmit such differential signal current through the load resistors 38 and 40 to produce a differential signal voltage across output terminals 44 and 46. Thus, any common mode signal applied to the inputs of the differential amplifier of the present invention is rejected and absorbed by the base to collector junctions of output transistors 14 and 16 before reaching the collectors of the output transistors even for common mode signals having large swings in amplitude, due to the use of the voltage clamping or bootstrap circuit of the present invention.

It should be noted that the transistors 14 and 16 can be replaced by vacuum tubes to provide a pair of conventional cascode amplifiers on opposite sides of the differential amplifier. However, by using transistors to provide hybrid cascode amplifiers, the isolation between the input and output terminals of the differential amplifier is increased, and the D.C. voltage between the common cathode connection 22 and the output terminals is reduced. In addition, the emitters of the output transistors provide a good low impedance point for applying a signal current or for applying a D.C. current to balance the amplifier. Also, the bases of such output transistors allow voltage clamping of the anodes of the tubes to the cathodes of such tubes, because of the near unity voltage gain of the emitter follower amplifier action of such transistors. In order to maintain the unity voltage gain of the bootstrap signal at high frequencies, a shunt capacitor 80 of .001 microfarad is connected across the coupling resistor 32 to provide a substantial constant voltage across such coupling resistor by compensating for the stray capacitance in the circuit.

It will be obvious to those having ordinary skill in the art that various changes may be made in the details of the above-described preferred embodiment of the present invention without departing from the spirit of the invention.

For example, one input terminal can be grounded to operate the differential amplifier as a paraphase amplifier to produce a push-pull output signal from a single ended input signal applied to the other input terminal. Therefore, the scope of the present invention should only be determined by the following claims.

I claim:

1. A differential amplifier comprising:
- an input circuit including a first pair of signal translating devices having their common electrodes connected together and having their input electrodes connected to the input terminals of said amplifier;
- an output circuit including a second pair of signal translating devices having their input electrodes connected to the output electrodes of said first pair of devices, having common electrodes coupled together, and having their output electrodes connected to the output terminals of said amplifier;
- means for connecting a high resistance to the common electrodes of said first pair of devices to cause the voltage on the common electrodes of said first pair of devices to follow the signal voltage on their input electrodes; and
- voltage clamp means for connecting the common electrodes of said first pair of devices respectively to the common electrodes of said second pair of devices and for maintaining the voltage difference between the common electrodes of said first and second pairs of devices substantially the same in order to prevent any common mode signal applied to said input terminals from changing the voltage difference between the common electrode and the output electrode across each of said first pair of devices so that said common mode signal is more effectively rejected before reaching said output terminals.

2. A differential amplifier comprising:
- an input circuit including a first pair of signal translating devices having their common electrodes connected together and having their input electrodes connected to the input terminals of said amplifier;
- an output circuit including a second pair of signal translating devices having their input electrodes connected to the output electrodes of said first pair of devices, having common electrodes coupled together, and having their output electrodes connected to the output terminals of said amplifier, said devices forming two cascode amplifiers on opposite sides of said differential amplifier;
- means for connecting a source of substantially constant direct current to the common electrodes of said first pair of devices to cause the voltage on the common electrodes of said first pair of devices to follow the signal voltage on their input electrodes; and
- voltage clamp means for connecting the common electrodes of said first pair of devices respectively to the common electrodes of said second pair of devices and for maintaining the voltage difference between the common electrodes of said first and second pairs of devices substantially the same in order to prevent any common mode signal applied to said input terminals from changing the voltage difference between the common electrode and the output electrode across each of said first pair of devices so that said common mode signal is more effectively rejected before reaching said output terminals.

3. A differential amplifier comprising:
- an input circuit including a pair of vacuum tubes having their common electrodes connected together and having their input electrodes connected to the input terminals of said amplifier;
- an output circuit including a pair of transistors having their emitter electrodes connected to the output electrodes of said tubes and having their collector electrodes connected to the output terminals of said amplifier, said tubes and transistors forming two hybrid cascode amplifiers; and means for connecting a high resistance between the common electrodes of said pair of tubes and a source of D.C. supply voltage to cause the voltage on the common electrodes of said tubes to follow the signal voltage on their input electrodes.

4. A hybrid differential amplifier comprising:

a pair of input vacuum tubes having their common electrodes connected together at a first cathode point and input grid electrodes connected to the input terminals of said differential amplifier;

a pair of output semiconductor devices each having their emitter electrodes connected to the anode electrodes of a different one of said tubes, having their collector electrodes connected to the output terminals of said differential amplifier, and having their base electrodes connected together at a second common point;

a coupling impedance connected between said first and second common points;

a first source of substantially constant current connected to said first common point and to one terminal of said coupling impedance; and a second source of substantially constant current connected to the other terminal of said coupling impedance and to said second common point so that the D.C. voltage across said coupling impedance remains fixed to maintain the voltage difference between said cathode electrodes and said base electrodes substantially constant and to cause the voltage of the cathodes and anodes of the tubes to follow the common mode signal applied to the grids of such tubes so that the operating points of the tubes are maintained substantially the same during large changes in the amplitude of the common mode signal.

5. A hybrid differential amplifier comprising:

a pair of input vacuum tubes having their cathodes connected together at a first common point and their grids connected to the input terminals of said differential amplifier;

a pair of output semiconductor devices each having their emitters connected to the anodes of a different one of said tubes, having their collectors connected to the output terminals of said differential amplifier, and having their bases connected together at a second common point in order to form two hybrid cascode amplifiers;

a coupling impedance connected between said first and second common points;

a first source of substantially constant current connected to said first common point and to one terminal of said coupling impedance; and a second source of substantially constant current connected to the other terminal of said coupling impedance and to said second common point so that the D.C. voltage across said coupling impedance remains fixed to maintain the voltage difference between said cathodes and said bases substantially constant and to cause the voltage of the cathodes and anodes of the tubes to follow the common mode signal applied to the grids of such tubes so that the operating points of the tubes are maintained substantially the same during large changes in the amplitude of the common mode signal.

6. A hybrid differential amplifier comprising:

a pair of input vacuum tubes having their cathodes connected together at a first common point and their grids connected to the input terminals of said differential amplifier;

a pair of output transistors each having their emitters connected to the anodes to a different one of said tubes, having their collectors connected to the output terminals of said differential amplifier, and having their bases connected together at a second common point in order to form two hybrid cascode amplifiers;

a pair of load resistors connected to the collectors of said output transistors;

a coupling resistor connected between said first and second common points;

a first source of substantially constant current connected to said first common point to one terminal of said coupling resistor; and a second source of substantially constant current connected to the other terminal of said coupling resistor so that the D.C. voltage across said coupling impedance remains fixed to maintain the voltage difference between said cathodes and said bases substantially constant and to cause the voltage of the cathodes and anodes of the tubes to follow the common mode signal applied to the grids of such tubes so that the operating points of the tubes are maintained substantially the same during large changes in the amplitude of the common mode signal.

7. A hybrid differential amplifier comprising:

a pair of input vacuum tubes having their cathodes connected together at a first common point and their grids connected to the input terminals of said differential amplifier;

a pair of output transistors each having their emitters connected to the anodes to a different one of said tubes, having their collectors connected to the output terminals of said differential amplifier, and having their bases connected together at a second common point in order to form two hybrid cascode amplifiers;

a coupling impedance including a resistor connected in parallel with a capacitor between said first and second common points;

a first source of substantially constant current connected to one terminal of said coupling impedance;

a second source of substantially constant current connected to the other terminal of said coupling impedance so that the D.C. voltage across said coupling impedance remains fixed to maintain the voltage difference between said cathodes and said bases substantially constant and to cause the voltage of the cathodes and anodes of the tubes to follow the common mode signal applied to the grids of such tubes so that the operating points of the tubes are maintained substantially the same during large changes in the amplitude of the common mode signal; and a bias impedance connected between the emitters of the output transistors and a D.C. voltage source, said bias impedance including a variable resistance for balancing the D.C. output voltages on the output terminals of said differential amplifier.

References Cited

UNITED STATES PATENTS

| | | | |
|---|---|---|---|
| 3,156,873 | 11/1964 | Williams | 330—69 |
| 3,262,066 | 7/1966 | Trilling | 330—69 |
| 3,275,944 | 9/1966 | Lavin | 330—30 X |

OTHER REFERENCES

Technical Articles and Papers—Fairchild Semiconductor Corp.

"A New DC Transistor Differential Amplifier," pp. 1–10, by Hilbiber, specifically page 4, FIG. 5.

NATHAN KAUFMAN, *Primary Examiner.*

U.S. Cl. X.R.

307—316; 330—18, 24, 26, 30, 40